United States Patent
Hsieh

(10) Patent No.: US 12,148,722 B2
(45) Date of Patent: Nov. 19, 2024

(54) SEMICONDUCTOR DEVICE WITH BARRIER LAYER

(71) Applicant: NANYA TECHNOLOGY CORPORATION, New Taipei (TW)

(72) Inventor: Ming-Hung Hsieh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 217 days.

(21) Appl. No.: 17/747,300

(22) Filed: May 18, 2022

(65) Prior Publication Data

US 2022/0336390 A1  Oct. 20, 2022

Related U.S. Application Data

(62) Division of application No. 17/234,282, filed on Apr. 19, 2021, now Pat. No. 11,545,453.

(51) Int. Cl.
  *H01L 23/00* (2006.01)
(52) U.S. Cl.
  CPC ............. *H01L 24/05* (2013.01); *H01L 24/03* (2013.01); *H01L 2224/0401* (2013.01); *H01L 2224/05017* (2013.01); *H01L 2224/05124* (2013.01); *H01L 2224/05147* (2013.01); *H01L 2224/05688* (2013.01)
(58) Field of Classification Search
  CPC ........... H01L 24/03; H01L 2224/05017; H01L 2224/05147; H01L 2224/05124
  See application file for complete search history.

(56) References Cited

U.S. PATENT DOCUMENTS

| 7,579,694 | B2 * | 8/2009 | Jan .......................... H01L 24/13 |
| | | | 257/E27.137 |
| 9,831,275 | B2 * | 11/2017 | Koezuka ........... H01L 29/78606 |
| 2005/0136662 | A1 | 6/2005 | Tsai et al. |
| 2019/0252312 | A1 * | 8/2019 | Yu ..................... H01L 21/76802 |
| 2019/0348621 | A1 * | 11/2019 | Wojciechowski ...... C23C 14/35 |
| 2020/0035628 | A1 * | 1/2020 | Huang .................... H01L 24/05 |
| 2020/0235214 | A1 * | 7/2020 | Huang ............. H01L 21/02321 |

FOREIGN PATENT DOCUMENTS

| CN | 107121203 A | 9/2017 |
| CN | 112599475 A | 4/2021 |
| TW | 202109807 A | 3/2021 |

OTHER PUBLICATIONS

Office Action with the search report mailed on Sep. 30, 2022 related to Taiwanese Application No. 110135398.
Office Action mailed on Jun. 13, 2022 related to U.S. Appl. No. 17/234,282, wherein this application is a DIV of U.S. Appl. No. 17/234,282.

* cited by examiner

*Primary Examiner* — Dale E Page
*Assistant Examiner* — Wilner Jean Baptiste
(74) *Attorney, Agent, or Firm* — Xuan Zhang

(57) ABSTRACT

The present application discloses a semiconductor device with a barrier layer including aluminum fluoride and a method for fabricating the semiconductor device. The semiconductor device includes a substrate, a circuit layer positioned on the substrate, a pad layer positioned in the circuit layer and including aluminum and copper, a first barrier layer positioned on the pad layer and including aluminum fluoride, and a first connector positioned on the first barrier layer.

6 Claims, 17 Drawing Sheets

SEMICONDUCTOR DEVICE WITH BARRIER LAYER

CROSS-REFERENCE TO RELATED APPLICATION

This application is a divisional application of U.S. Non-Provisional application Ser. No. 17/234,282 filed 19 Apr. 2021, which is incorporated herein by reference in its entirety.

TECHNICAL FIELD

The present disclosure relates to a semiconductor device, and more particularly, to a semiconductor device with a barrier layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a circuit layer positioned on the substrate, a pad layer positioned in the circuit layer and including aluminum and copper, a first barrier layer positioned on the pad layer and including aluminum fluoride, and a first connector positioned on the first barrier layer.

In some embodiments, the semiconductor device includes a first passivation layer positioned on the circuit layer. The first barrier layer is positioned in the first passivation layer.

In some embodiments, a thickness of the first passivation layer is greater than a thickness of the first barrier layer.

In some embodiments, a bottom portion of the first connector is extending into the first passivation layer and positioned on the first barrier layer.

In some embodiments, the first barrier layer includes zinc oxide.

In some embodiments, the semiconductor device includes a thermal dissipation layer positioned below the substrate.

In some embodiments, the semiconductor device includes an attachment layer positioned between the thermal dissipation layer and the substrate.

In some embodiments, the semiconductor device includes a cushion layer positioned in the circuit layer and topographically aligned with the pad layer. The cushion layer is at a vertical level lower than a vertical level of the pad layer.

In some embodiments, the first barrier layer has a U-shaped cross-sectional profile.

Another aspect of the present disclosure provides a method for fabricating a semiconductor device including providing a substrate, forming a circuit layer on the substrate, forming a pad layer in the circuit layer, forming a first passivation layer on the circuit layer, forming a first opening along the first passivation layer to expose the pad layer, forming a first barrier layer on the pad layer and in the first opening, and forming a first connector on the first barrier layer. The pad layer includes aluminum and copper. The first barrier layer includes aluminum fluoride.

In some embodiments, the first barrier layer includes zinc oxide.

In some embodiments, a content of zinc oxide is greater than a content of aluminum fluoride.

In some embodiments, a process temperature of the step of forming the first passivation layer is between about 350° C. and about 450° C.

In some embodiments, a process pressure of the step of forming the first passivation layer is between 2.0 Torr and about 2.8 Torr.

In some embodiments, the step of forming the first opening includes argon and tetrafluoromethane as etchants.

In some embodiments, a process temperature of the step of forming the first opening is between about 120° C. and about 160° C.

In some embodiments, a process pressure of the step of forming the first opening is between about 0.3 Torr and about 0.4 Torr.

In some embodiments, the step of forming the first opening includes helium and nitrogen trifluoride as etchants.

In some embodiments, a process temperature of the step of forming the first opening is between about 80° C. and about 100° C.

In some embodiments, a process pressure of the step of forming the first opening is between about 1.2 Torr and about 1.3 Torr.

Due to the design of the semiconductor device of the present disclosure, the saturated bonding property of aluminum fluoride may prevent the underlying pad layer from corrosion from various semiconductor processes, especially those processes including fluorine ions. As a result, the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
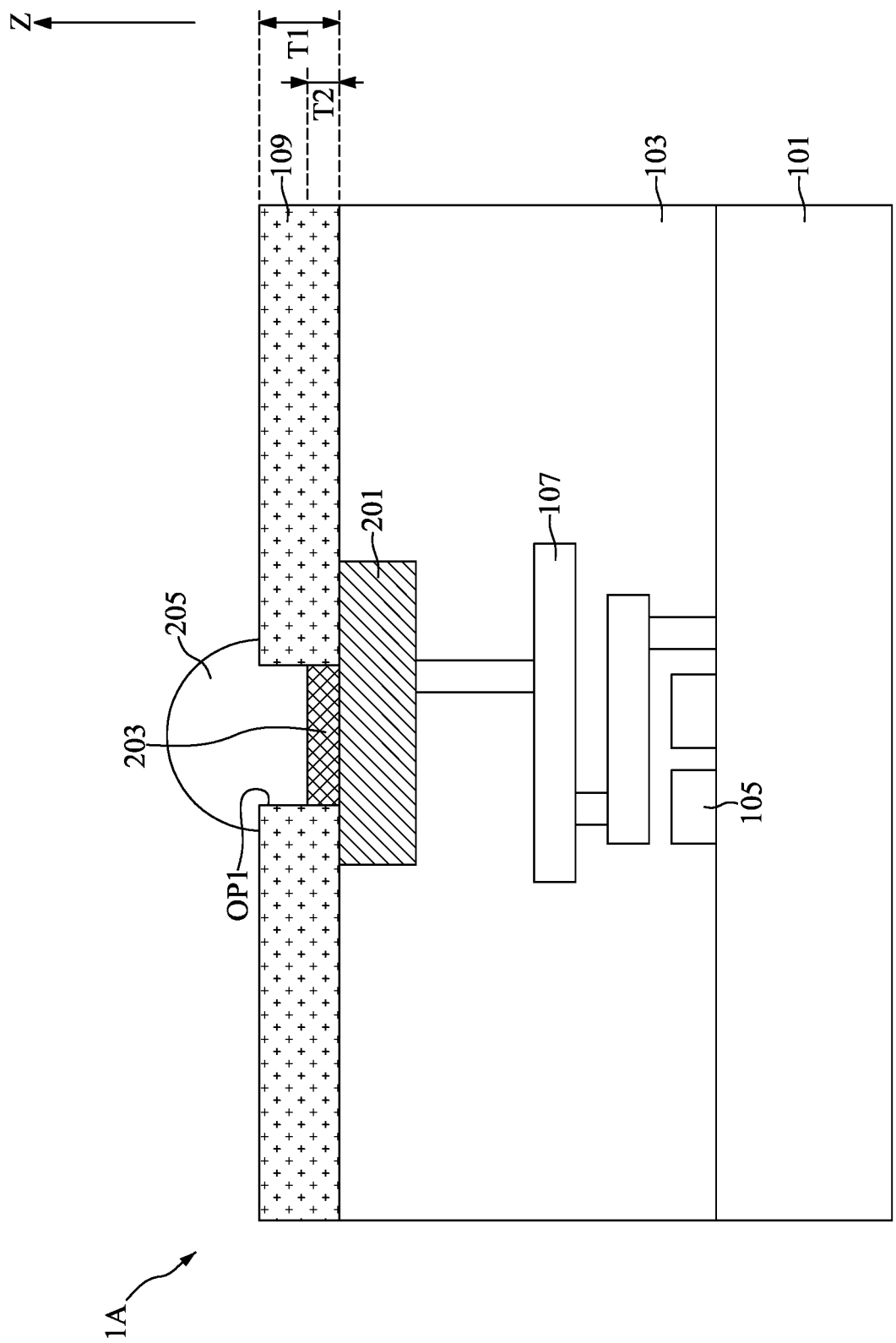
FIGS. 1 to 5 illustrate, in schematic cross-sectional view diagrams, semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIGS. 1 to 5 illustrate, in schematic cross-sectional view diagrams, semiconductor devices 1A, 1B, 1C, 1D, and 1E in accordance with some embodiments of the present disclosure.

With reference to FIG. 1, the semiconductor device 1A may include a substrate 101, a circuit layer 103, a plurality of device elements 105, a plurality of conductive features 107, a first passivation layer 109, a pad layer 201, a first barrier layer 203, and a first connector 205.

With reference to FIG. 1, the substrate 101 may include a bulk semiconductor substrate that is composed at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current and reduces parasitic capacitance of the semiconductor device 1A.

With reference to FIG. 1, the circuit layer 103 may be disposed on the substrate 101. The circuit layer 103 may include inter-layer dielectric layers and/or inter-metal dielectric layers containing the plurality of device elements 105 and the plurality of conductive features 107. The plurality of device elements 105 may be transistors such as complementary metal-oxide-semiconductor transistors, metal-oxide-semiconductor field-effect transistors, fin field-effect-transistors, the like, or a combination thereof. The plurality of conductive features 107 may include conductive plugs, conductive lines, and conductive vias, or other suitable conductive elements.

The plurality of conductive features 107 may electrically connect the plurality of device elements 105, respectively and correspondingly, to form functional units in the circuit layer 103. A functional unit, in the description of the present disclosure, generally refers to functionally related logic circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex. In the present embodiment, the circuit layer 103 including the plurality of device elements 105 may be served as a memory.

The inter-layer dielectric layers and/or the inter-metal dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0.

The plurality of conductive features 107 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 1, the pad layer 201 may be disposed in the circuit layer 103 and may be electrically coupled to a corresponding device element 105 through corresponding conductive features 107. The top surface of the pad layer 201 and the top surface of the circuit layer 103 may be substantially coplanar. The pad layer 201 may have a thickness between about 400 nm and about 1100 nm. In some embodiments, the pad layer 201 may be formed of, for example, aluminum-copper alloy. Small quantities of copper in aluminum may improve the electromigration resistance and further reduces the occurrence of hillocks that is small protrusions of aluminum on a surface of a thin film layer of aluminum.

In some embodiments, the pad layer 201 may be formed of, for example, pure aluminum. In some embodiments, the layer of circuit layer 103 where the pad layer 201 is disposed may be formed of a polymeric material such as polybenzoxazole, polyimide, benzocyclobutene, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In addition, some photosensitive polymeric material (e.g., photosensitive polyimide) may have all aforementioned characteristics and may be patterned like a photoresist mask and may, after patterning and etching, remain on the surface on which the photosensitive polymeric material have been deposited to serve as part of a passivation layer.

It should be noted that, in the description of the present disclosure, the number of the pad layer 201 is for illustrative purpose. For example, the number of pad layer 201 can be more than one.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 1, the first passivation layer 109 may be disposed on the circuit layer 103. The first passivation layer 109 may be a single layer structure or a multi-layer structure. In some embodiments, the first passivation layer 109 may include polybenzoxazole, polyimide, benzocyclobutene, solder resist film, the like, or a combination thereof. The first passivation layer 109 formed of polymeric material may have same attractive characteristics aforementioned, and descriptions thereof are not repeated herein. In some other embodiments, the first passivation layer 109 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof.

With reference to FIG. 1, a first opening OP1 may be disposed along the first passivation layer 109 to expose a portion of the pad layer 201. In some embodiments, the sidewalls of the first opening OP1 may be substantially vertical. In some embodiments, the sidewalls of the first opening OP1 may be tapered. It should be noted that, in the description of the present disclosure, a surface is "substantially vertical" if there exists a vertical plane from which the surface does not deviate by more than three times the root mean square roughness of the surface.

With reference to FIG. 1, the first barrier layer 203 may be disposed on the pad layer 201 and in the first passivation layer 109. The first barrier layer 203 may have a thickness T1 less than a thickness T2 of the first passivation layer 109. The first barrier layer 203 may include aluminum fluoride. Due to saturated bonding property of aluminum fluoride, it is stable and may prevent the underlying pad layer 201 from corrosion from various semiconductor processes, especially those processes including fluorine ions. In some embodiments, the first barrier layer 203 may further include zinc oxide which may increase electrical properties of the first barrier layer 203. In some embodiments, the content of zinc oxide may be greater than the content of aluminum fluoride.

With reference to FIG. 1, the first connector 205 may be disposed on the first barrier layer 203. The lower portion of the first connector 205 may be extending to the first passivation layer 109, completely filled the first opening OP1, and disposed on the first barrier layer 203. The upper portion of the first connector 205 may be protruding from a plane coplanar with the top surface of the first passivation layer 109, and disposed on the lower portion of the first connector 205. In some embodiments, the first connector 205 may include a conductive material with low resistivity, such as tin, lead, silver, copper, nickel, bismuth or an alloy thereof.

In some embodiments, the first connector 205 may be a solder joint. The solder joint may comprise a material such as tin, or other suitable material, such as silver or copper. In an embodiment in which the solder joint is tin solder joint, the solder joint may be formed by initially forming a layer of tin through evaporation, electroplating, printing, solder transfer, or ball placement to a thickness of about 10 μm to about 100 μm. Once the layer of tin has been formed and filled the first opening OP1 and on the first passivation layer 109, a reflow process may be performed to shape the solder joint into the desired shape.

Figure 2:
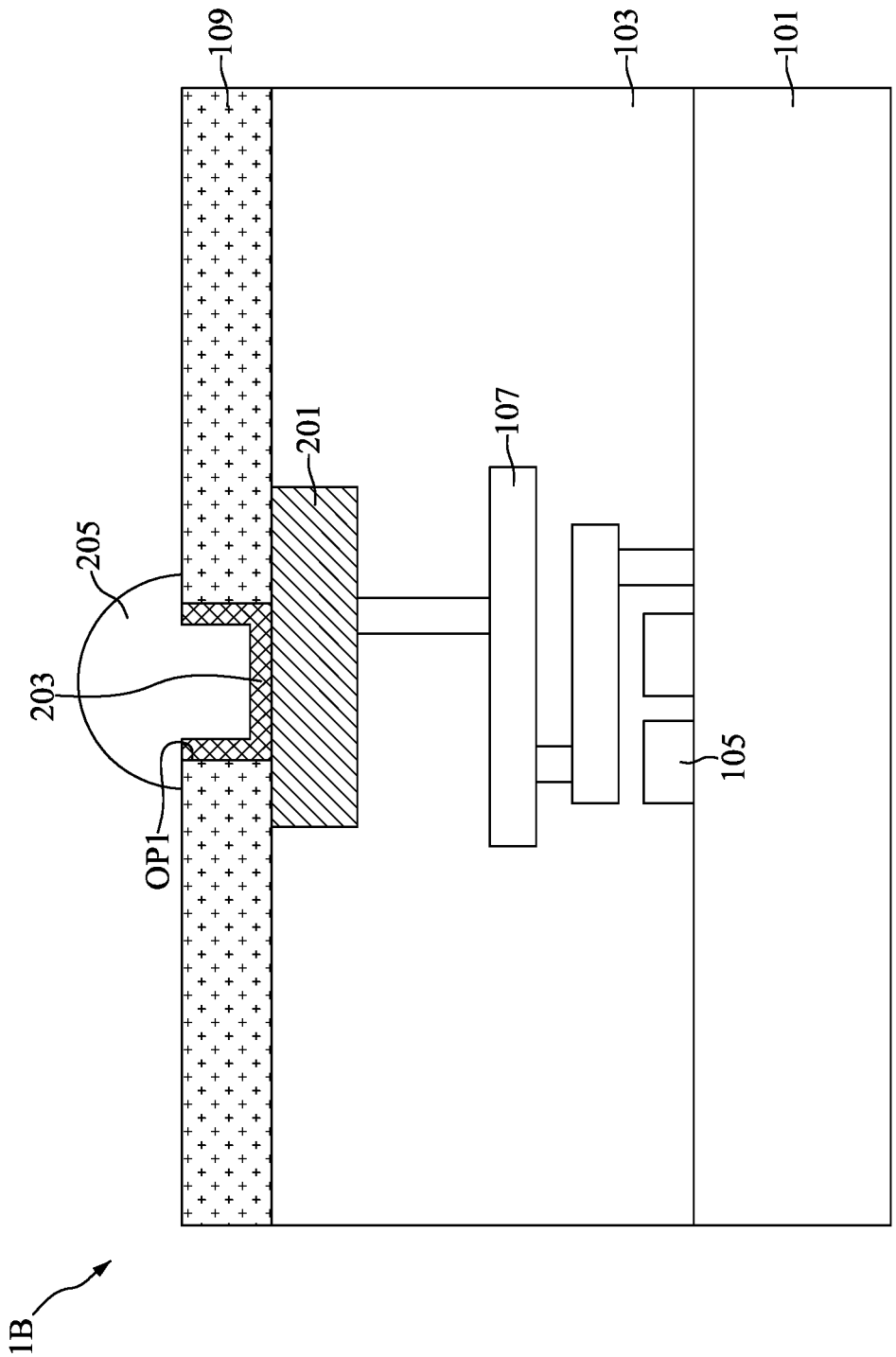

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted. The first barrier layer 203 may be conformally disposed in the first opening OP1. Specifically, the first barrier layer 203 may be disposed on the pad layer 201 and on the sidewalls of the first opening OP1. In other words, the first barrier layer 203 may have a U-shape cross-sectional profile.

Figure 3:
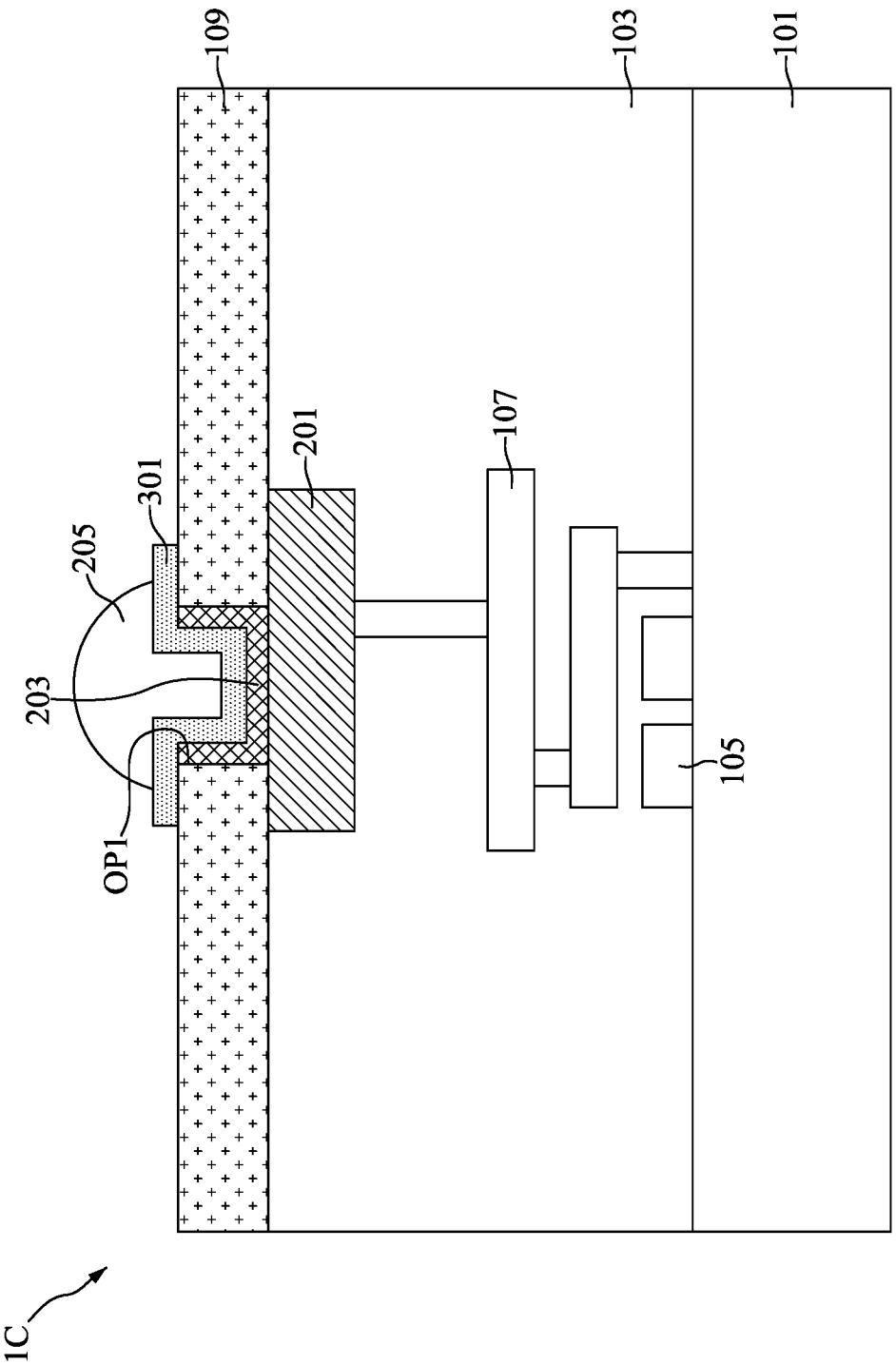

With reference to FIG. 3, the semiconductor device 1C may have a structure similar to that illustrated in FIG. 2. The same or similar elements in FIG. 3 as in FIG. 2 have been marked with similar reference numbers and duplicative descriptions have been omitted. The semiconductor device 1C may include an under bump metallization layer 301. The under bump metallization layer 301 may be conformally disposed on the first barrier layer 203 and in the first opening OP1. The under bump metallization layer 301 may be a single layer structure or a stacked structure of multiple layers. For example, the under bump metallization layer 301 may include a first conductive layer, a second conductive layer, and a third conductive layer stacked sequentially. The first conductive layer may serve as an adhesive layer for stably attaching the first connector 205 to the first barrier layer 203. For example, the first conductive layer may include at least one of titanium, titanium-tungsten, chromium, and aluminum. The second conductive layer may also serve as a barrier layer for preventing a conductive material contained in the first connector 205 from diffusing into the pad layer 201. The second conductive layer may include at least one of copper, nickel, chromium-copper, and nickel-vanadium. The third conductive layer may serve as a seed layer for forming the first connector 205 or as a wetting layer for improving wetting characteristics of the first connector 205. The third conductive layer may include at least one of nickel, copper, and aluminum.

Figure 4:
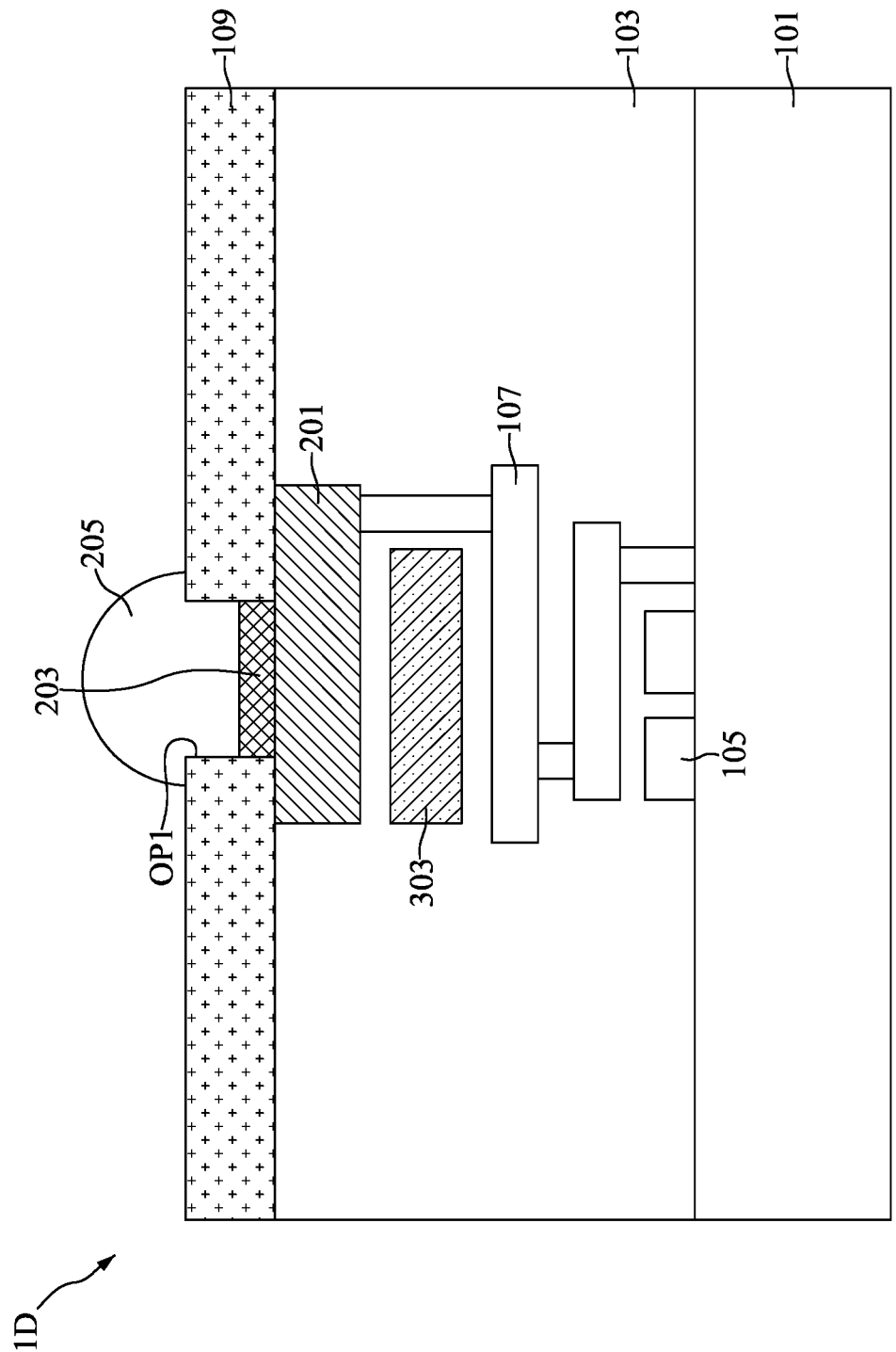

With reference to FIG. 4, the semiconductor device 1D may have a structure similar to that illustrated in FIG. 1. The same or similar elements in FIG. 4 as in FIG. 1 have been marked with similar reference numbers and duplicative descriptions have been omitted. The semiconductor device 1D may include a cushion layer 303. The cushion layer 303 may be disposed in the circuit layer 103 and may be topographically aligned with the pad layer 201. The cushion layer 303 may be at a vertical level lower than a vertical level of the pad layer 201. In some embodiments, the cushion layer 303 and the pad layer 201 may not contact each other. The cushion layer 303 may be utilized to absorb and redistribute the stress concentrated on the underlying layers created by the shear stresses from thermal expansion mismatches and normal stresses due to a wiring process or bumping process. The cushion layer 303 may be formed of, for example, a material having a coefficient of thermal expansion of less than about 20 ppm/° C. and a Young's Modulus of less than about 15 GPa. Specifically, the cushion layer 303 may be formed of a material including polyimide or an epoxy-based material. The cushion layer 303 may have a thickness between about 500 nm and about 10000 nm. Preferably, the thickness of the cushion layer 303 may be between about 1000 nm and about 5000 nm. The cushion layer 303 may serve as a cushion to reduce a stress of a bumping process or a wiring process; therefore, the delamination of the first passivation layer 109 or the upper portion of the circuit layer 103 may be reduced.

Figure 5:
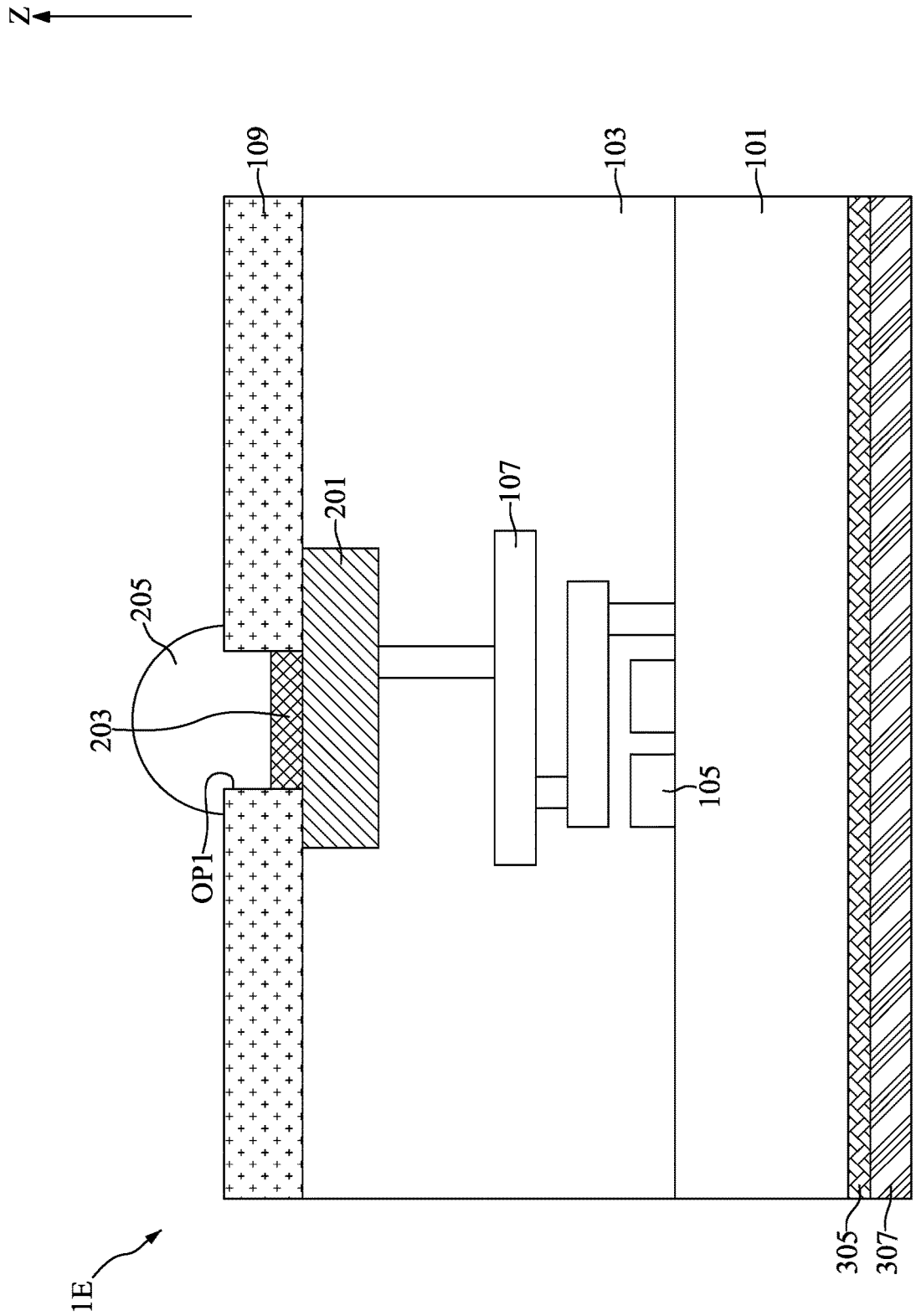

With reference to FIG. 5, the semiconductor device 1E may have a structure similar to that illustrated in FIG. 1. The same or similar elements in FIG. 5 as in FIG. 1 have been marked with similar reference numbers and duplicative descriptions have been omitted. The semiconductor device 1E may include an attachment layer 305 and a thermal dissipation layer 307.

With reference to FIG. 5, the thermal dissipation layer 307 may be disposed below the substrate 101. The attachment layer 305 may be used to attach the thermal dissipation layer 307 to the substrate 101. In some embodiments, the attachment layer 305 may include a die attach film, silver paste, or the like. In some embodiments, the thermal dissipation layer 307 may be formed of, for example, a composite material selected from the group consisting of silicon carbide, aluminum nitride, graphite, and the like. The thermal dissipation layer 307 may have a good thermal conductivity, which may be greater than about 2 W/m·K. In some embodiments, the thermal dissipation layer 307 may have high thermal conductivity greater than about 100 W/m·K, and may be formed using a metal, a metal alloy, or the like. For example, the thermal dissipation layer 307 may comprise metals and/or metal alloys selected from the group consisting of aluminum, copper, nickel, cobalt, and the like.

In some embodiments, the thermal dissipation layer 307 may be formed of a carbon material that is imbued with a flexible material such as a polymer matrix. For example, the thermal dissipation layer 307 may include generally vertically oriented graphite and carbon nanotubes, which are imbued with a fluoropolymer rubber matrix. The aspect ratio of the carbon nanotubes may be between about 1:1 and about 1:100. For another example, the thermal dissipation layer 307 may include graphitic carbon. For yet another example, the thermal dissipation layer 307 may include pyrolytic graphite sheet. In some embodiments, a thermal resistance of the thermal dissipation layer 307 may be less than 0.2° C. cm2/Watt at a thickness between about 250 μm and about 450 μm. The thermal dissipation layer 307 may provide additional thermal dissipation capability to the semiconductor device 1E.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 6:
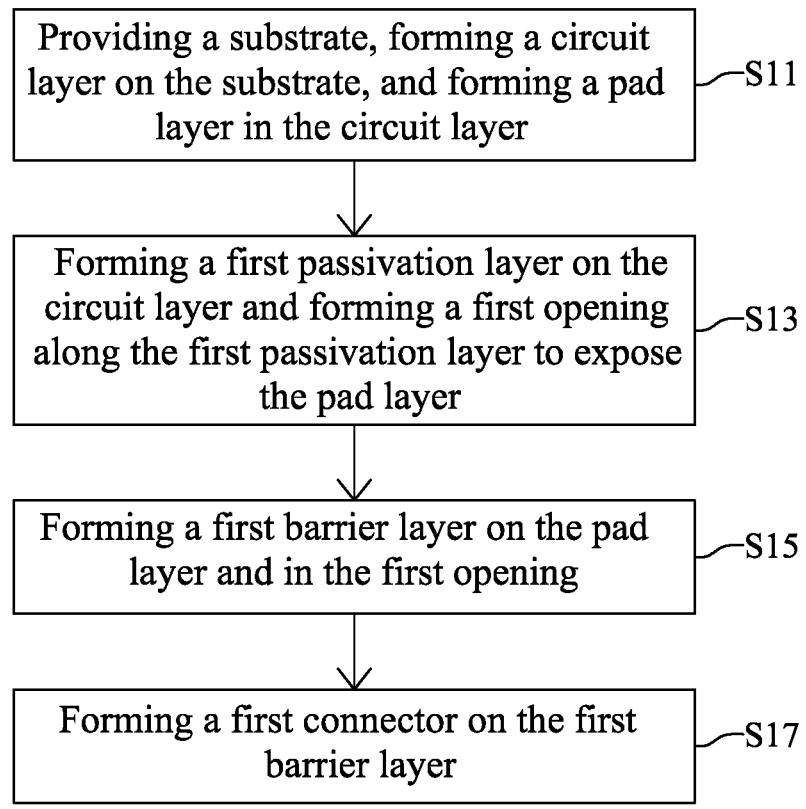
FIG. 6 illustrates, in a flowchart diagram form, a method for fabricating a semiconductor device in accordance with one embodiment of the present disclosure.

FIG. 6 illustrates, in a flowchart diagram form, a method 10 for fabricating a semiconductor device 1A in accordance with one embodiment of the present disclosure. FIGS. 7 to 11 illustrate, in schematic cross-sectional view diagrams, a flow for fabricating the semiconductor device 1A in accordance with one embodiment of the present disclosure.

Figure 7:
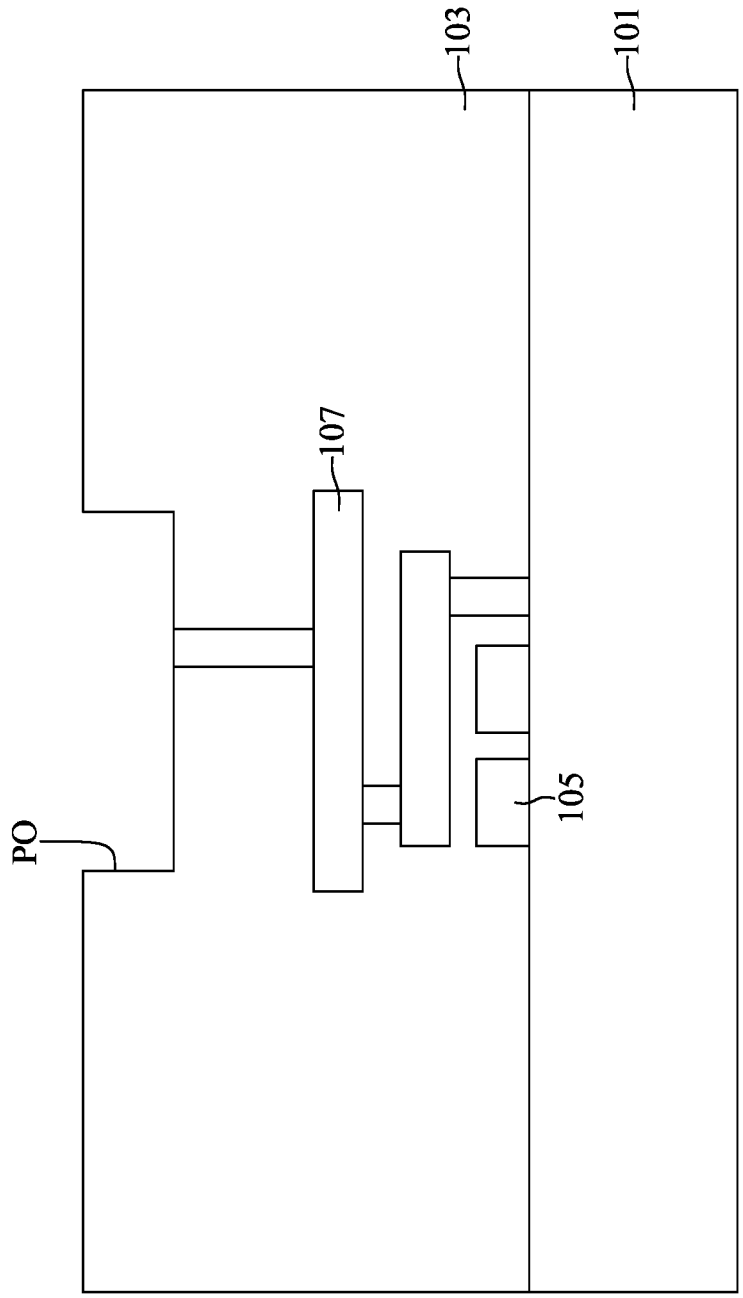
FIGS. 7 to 11 illustrate, in schematic cross-sectional view diagrams, a flow for fabricating the semiconductor device in accordance with one embodiment of the present disclosure.
Figure 8:
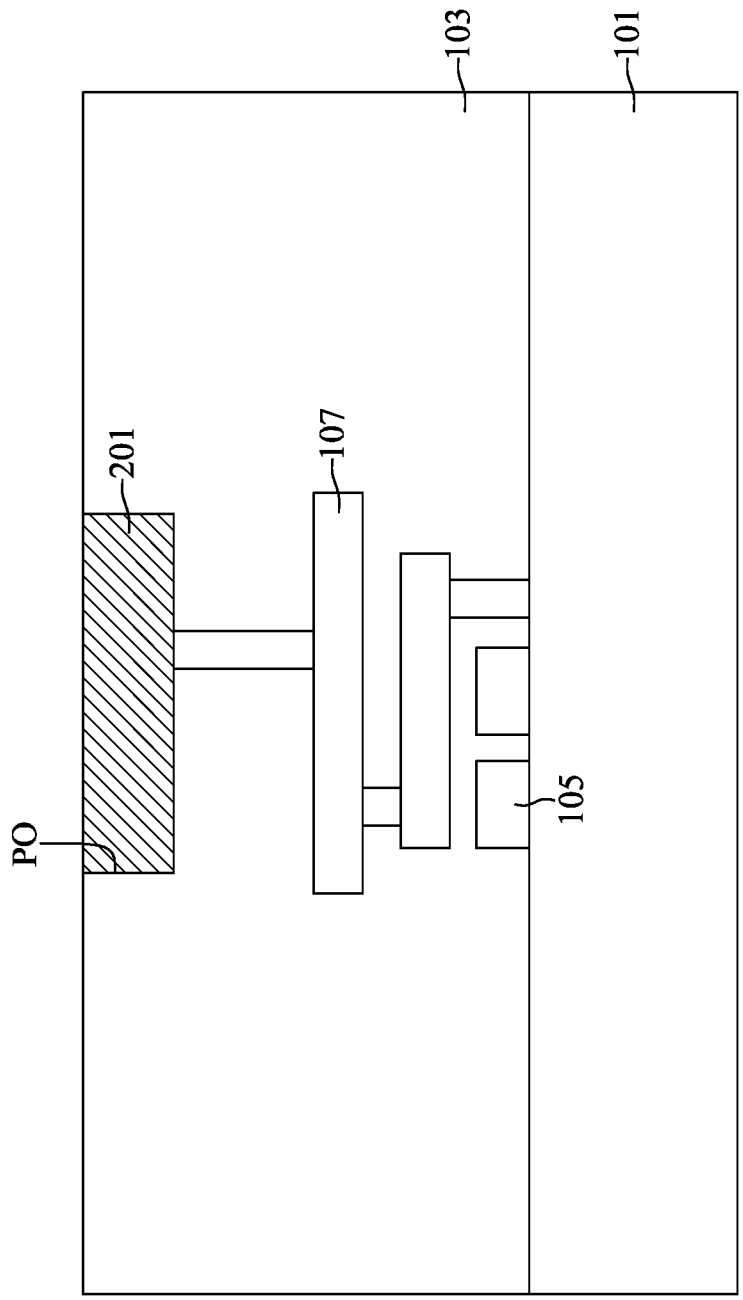

With reference to FIGS. 6 to 8, at step S11, a substrate 101 may be provided, a circuit layer 103 may be formed on the substrate 101, and a pad layer 201 may be formed in the circuit layer 103.

With reference to FIG. 7, the substrate 101 and the circuit layer 103 may respectively have structure similar to that illustrated in FIG. 1, and descriptions thereof are not repeated herein. The inter-layer dielectric layers and/or the inter-metal dielectric layers of the circuit layer 103 may be formed by deposition processes such as chemical vapor deposition, plasma-enhanced chemical vapor deposition, or the like. Planarization processes may be performed after the deposition processes to remove excess material and provide a substantially flat surface for subsequent processing steps. The plurality of device elements 105 and the plurality of conductive features 107 may be formed during the formation of the inter-layer dielectric layers and/or the inter-metal dielectric layers.

With reference to FIG. 7, the pad opening PO may be formed in the circuit layer 103. The pad opening PO may be formed by patterning the circuit layer 103 using a photolithography process with a following etching process.

In some embodiments, the etching process may be an anisotropic dry etching process using argon and tetrafluoromethane as etchants. A process temperature of the etching process may be between about 120° C. and about 160° C. A process pressure of the etching process is between about 0.3 Torr and about 0.4 Torr. A process duration of the etching process may be between about 33 and about 39 seconds.

Alternatively, in some embodiments, the etching process may be an anisotropic dry etching process using helium and nitrogen trifluoride as etchants. A process temperature of the etching process may be between about 80° C. and about 100° C. A process pressure of the etching process is between about 1.2 Torr and about 1.3 Torr. A process duration of the etching process may be between about 20 seconds and about 30 seconds.

In some embodiments, a cleaning process may be performed after the aforementioned etching process. The cleaning process may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process. The bias energy may be between about 0 W and 200 W. The cleaning process may remove oxide, originating from oxidation by oxygen in the air, from a top surface of a conductive feature 107 exposed through the pad opening PO without damaging the conductive feature 107.

A passivation process may be subsequently performed over the circuit layer 103 and the pad opening PO. The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the circuit layer 103 exposed through the pad opening PO by sealing surface pores thereof to reduce undesirable sidewall growth, which may affect the electric characteristics of the semiconductor device 1A, during subsequent processing steps. As a result, the performance and reliability of the semiconductor device 1A may be increased.

With reference to FIG. 8, the pad layer 201 may be sequentially formed in the pad opening PO by sputtering, electroplating, or electroless plating. For example, when the pad layer 201 is formed by sputtering using aluminum-copper material as source, a process temperature of sputtering may be between about 100° C. and about 400° C. A process pressure of sputtering may be between about 1 mTorr and about 100 mTorr. After sputtering, an etching process may be performed to trim the pattern of the pad layer 201. The etching process may use chlorine and argon as etchants. The etchant flow of chlorine may be between about 10 sccm (standard cubic centimeters per minute) and about 30 sccm. The etchant flow of argon may be between about 900 sccm and about 1100 sccm. A process temperature of the etching process may be between about 50° C. and about 200° C. A process pressure of the etching process may be between about 50 mTorr and about 10 Torr. A process duration of the etching process may be between about 30 seconds and about 200 seconds.

Figure 9:
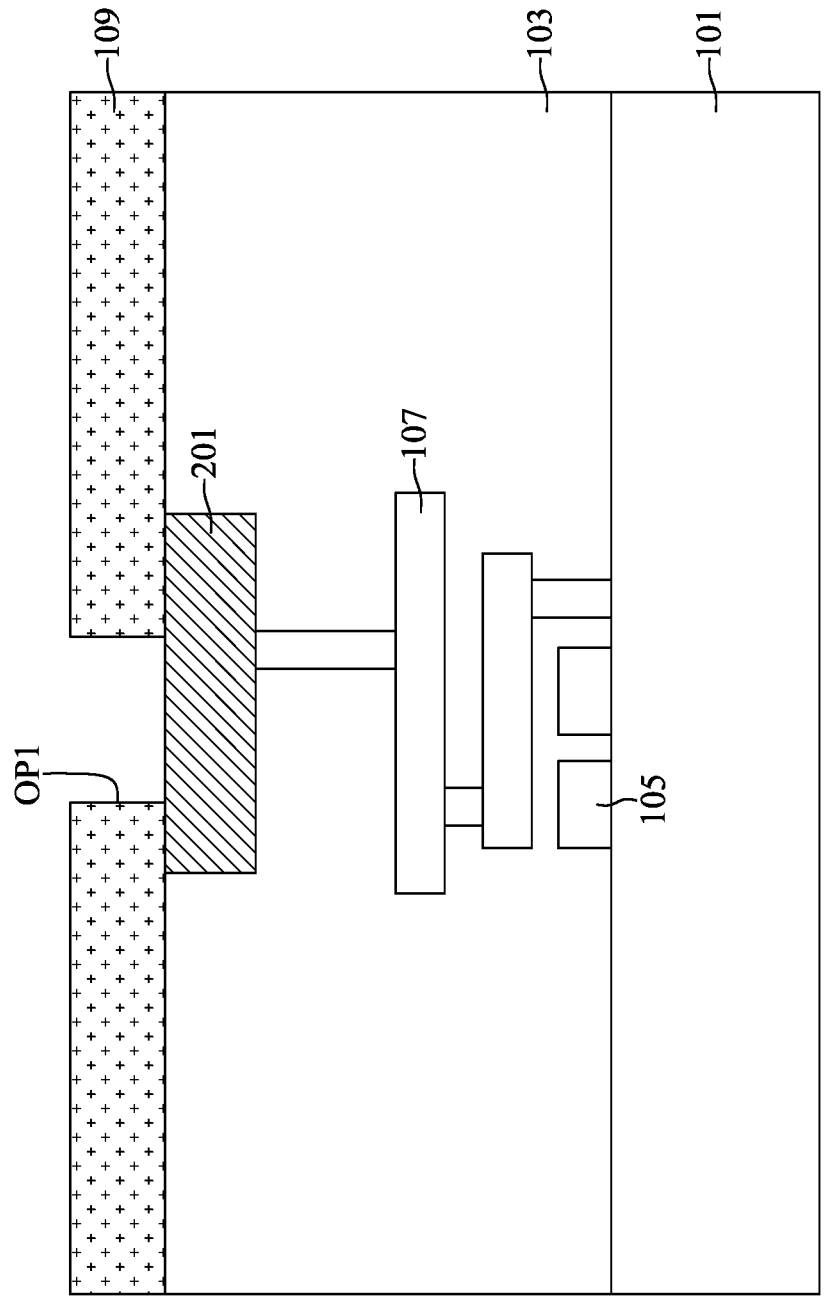

With reference to FIGS. 6 and 9, at step S13, a first passivation layer 109 may be formed on the circuit layer 103 and a first opening OP1 may be formed along the first passivation layer 109 to expose the pad layer 201.

With reference to FIG. 9, the first passivation layer 109 may be formed by, for example, spin-coating, lamination, deposition, or the like. The deposition may include chemical vapor deposition such as plasma-enhanced chemical vapor deposition. A process temperature of the plasma-enhanced chemical vapor deposition may be between about 350° C. and about 450° C. A process pressure of the plasma-enhanced chemical vapor deposition may be between about 2.0 Torr and about 2.8 Torr. A process duration of the plasma-enhanced chemical vapor deposition may be between about 8 seconds and about 12 seconds.

With reference to FIG. 9, the first opening OP1 may be formed by a photolithography process and a following etching process. In some embodiments, the etching process may be an anisotropic dry etching process using argon and tetrafluoromethane as etchants. A process temperature of the etching process may be between about 120° C. and about 160° C. A process pressure of the etching process is between about 0.3 Torr and about 0.4 Torr. A process duration of the etching process may be between about 33 and about 39 seconds.

Alternatively, in some embodiments, the etching process may be an anisotropic dry etching process using helium and nitrogen trifluoride as etchants. A process temperature of the etching process may be between about 80° C. and about 100° C. A process pressure of the etching process is between about 1.2 Torr and about 1.3 Torr. A process duration of the etching process may be between about 20 seconds and about 30 seconds.

In some embodiments, a cleaning process may be performed after the aforementioned etching process. The cleaning process may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process. The bias energy may be between about 0 W and 200 W. The cleaning process may remove oxide, originating from oxidation by oxygen in the air, from the top surface of the pad layer 201 exposed through the first opening OP1 without damaging the pad layer 201.

A passivation process may be subsequently performed over the first passivation layer 109 and the first opening OP1. The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the first passivation layer 109 exposed through the first opening OP1 by sealing surface pores thereof to reduce undesirable sidewall growth, which may affect the electric characteristics of the semiconductor device 1A, during subsequent processing steps. As a result, the performance and reliability of the semiconductor device 1A may be increased.

Figure 10:
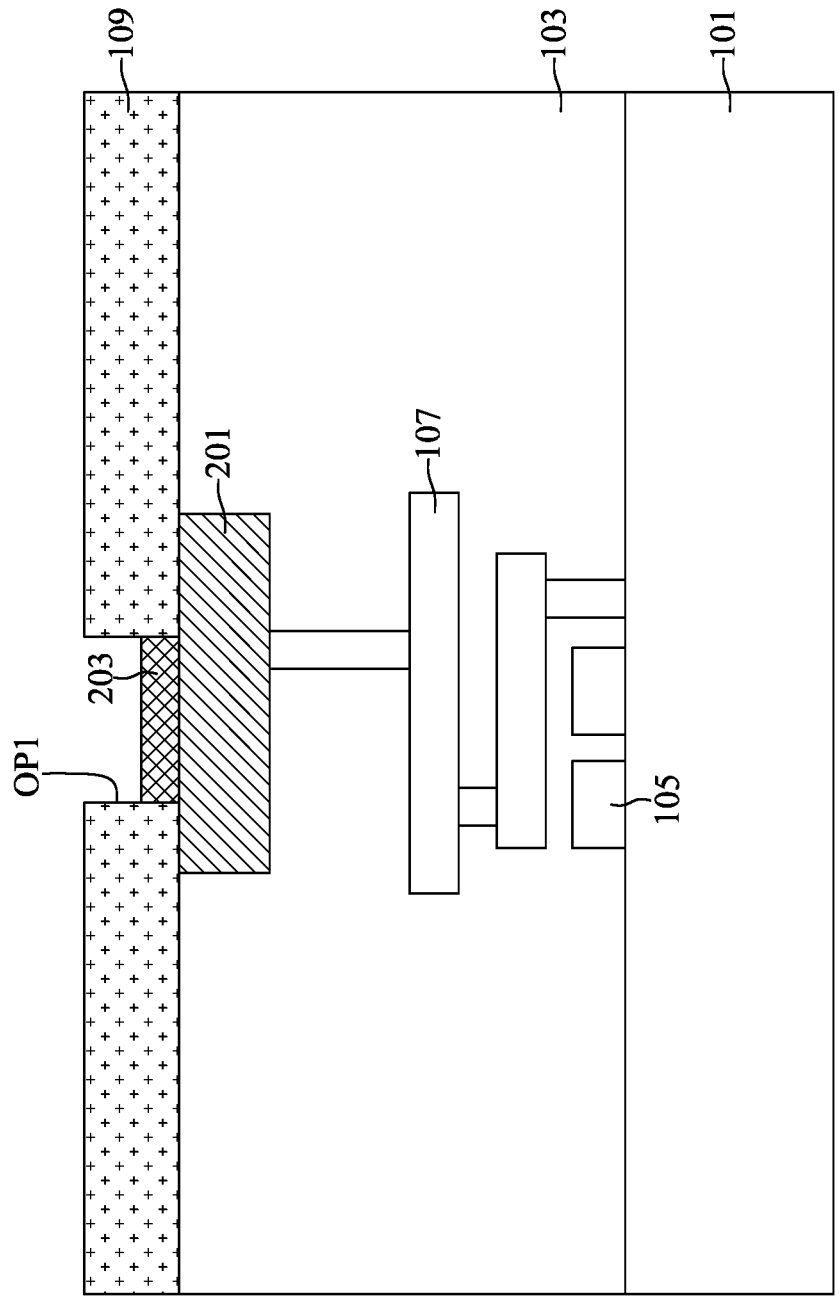

With reference to FIGS. 6 and 10, at step S15, a first barrier layer 203 may be formed on the pad layer 201 and in the first opening OP1.

With reference to FIG. 10, in some embodiment, the first barrier layer 203 may be formed by a sputtering process. The source of the sputtering process may include aluminum and sulfur hexafluoride or fluorine. The sulfur hexafluoride or fluorine may be decomposed in plasma and provides the fluorination sources such as fluoride ions and fluoride radicals to react with deposited films.

In some embodiments, the source of the sputtering process may include zinc oxide and aluminum fluoride. A ratio of the sputtering power of zinc oxide to the sputtering power of aluminum fluoride may be about 100 W:75 W.

In some embodiments, the sputtering process may completely fill the first opening OP1. An etch back process may be performed to recess the thickness of the first barrier layer 203. The etch rate ratio of the first barrier layer 203 to the first passivation layer 109 may be between about 100:1 and about 1.05:1, between about 15:1 and about 2:1, or between about 10:1 and about 2:1 during the etch back process.

Figure 11:
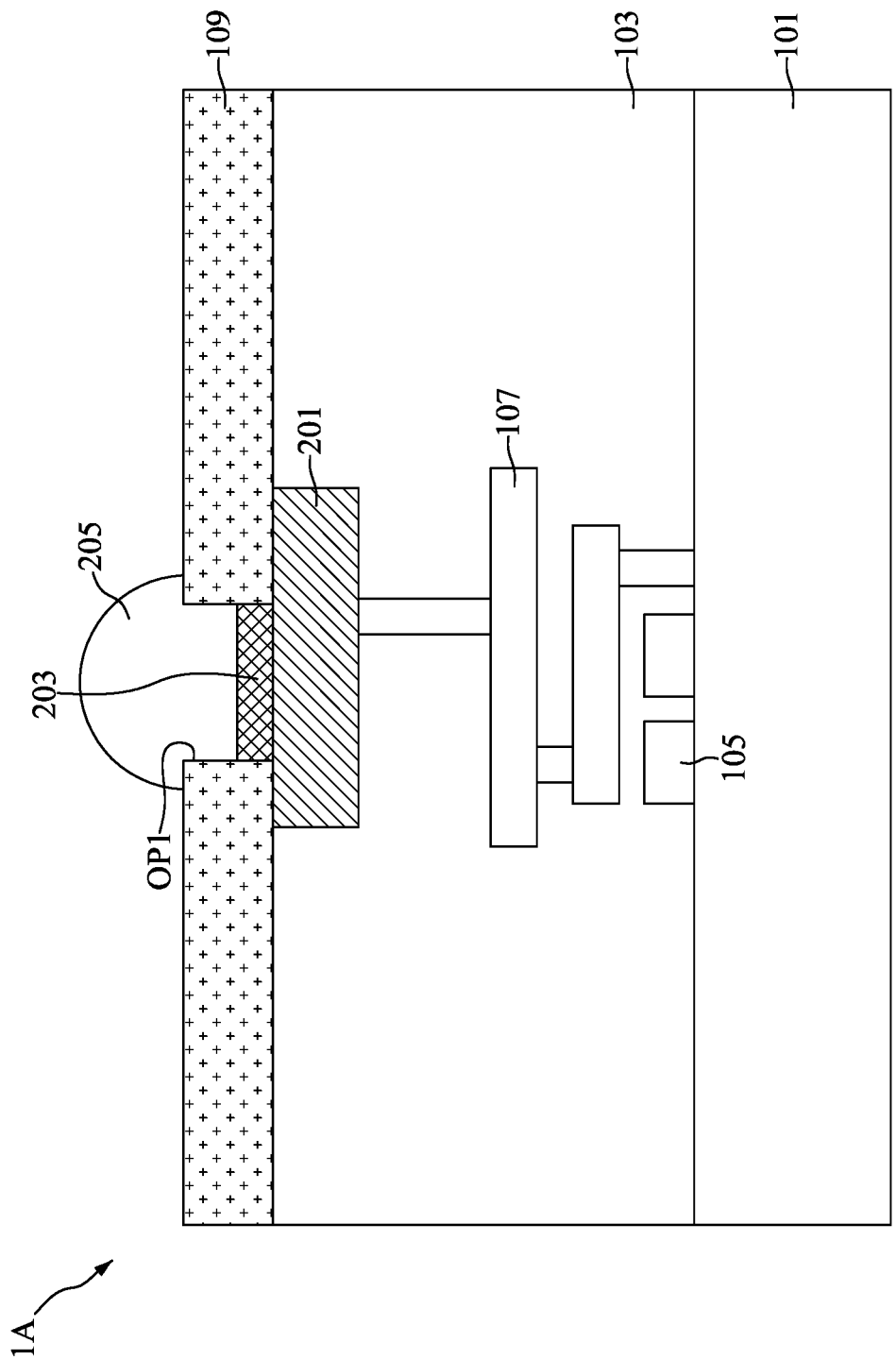

With reference to FIGS. 6 and 11, at step S17, a first connector 205 may be formed on the first barrier layer 203.

With reference to FIG. 11, the first connector 205 may be formed by a suitable process such as evaporation, plating, ball drop, or screen printing. In some embodiments, the first connector 205 may be controlled collapse chip connection (i.e., C4) bumps formed by a C4 process.

Figure 12:
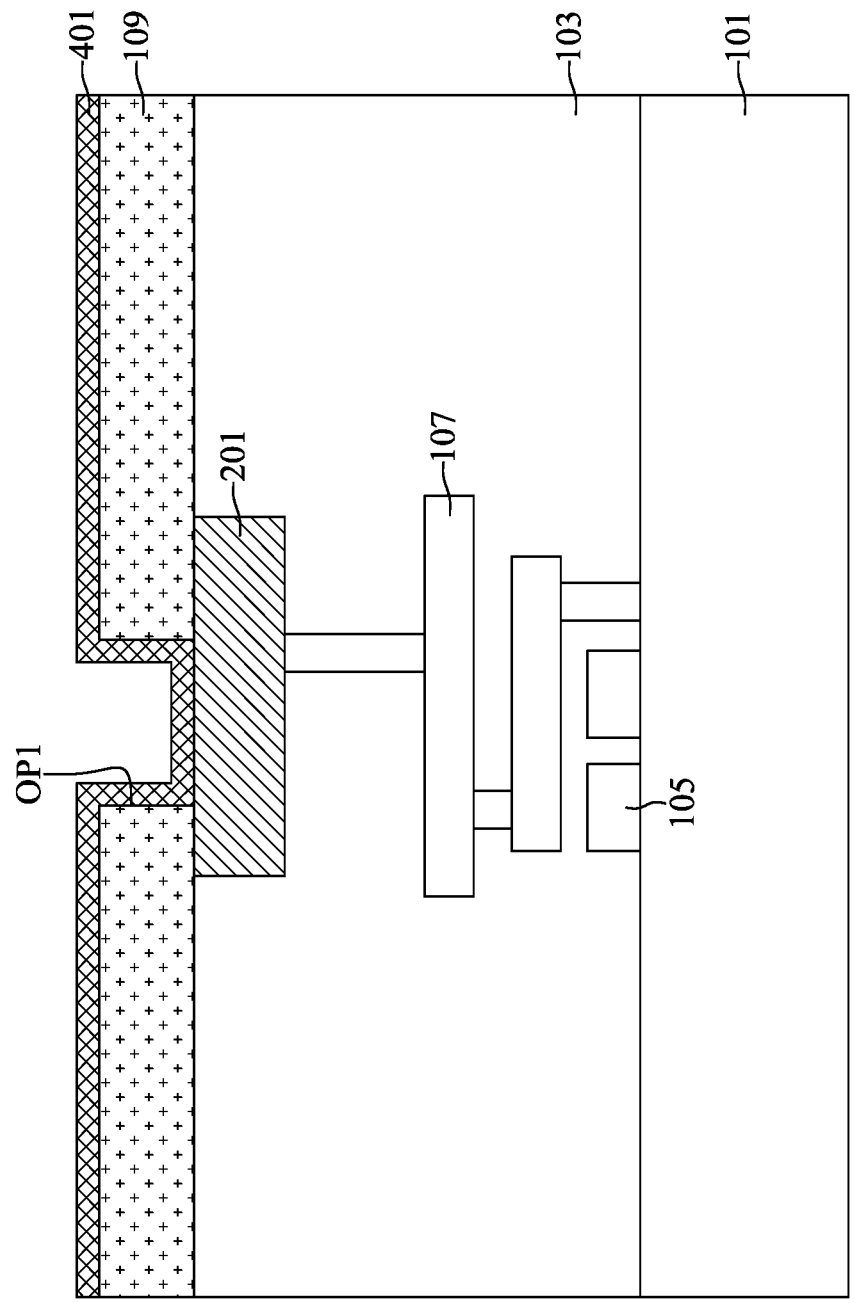
FIGS. 12 to 14 illustrate, in schematic cross-sectional view diagrams, a flow for fabricating a semiconductor device in accordance with another embodiment of the present disclosure.
Figure 13:
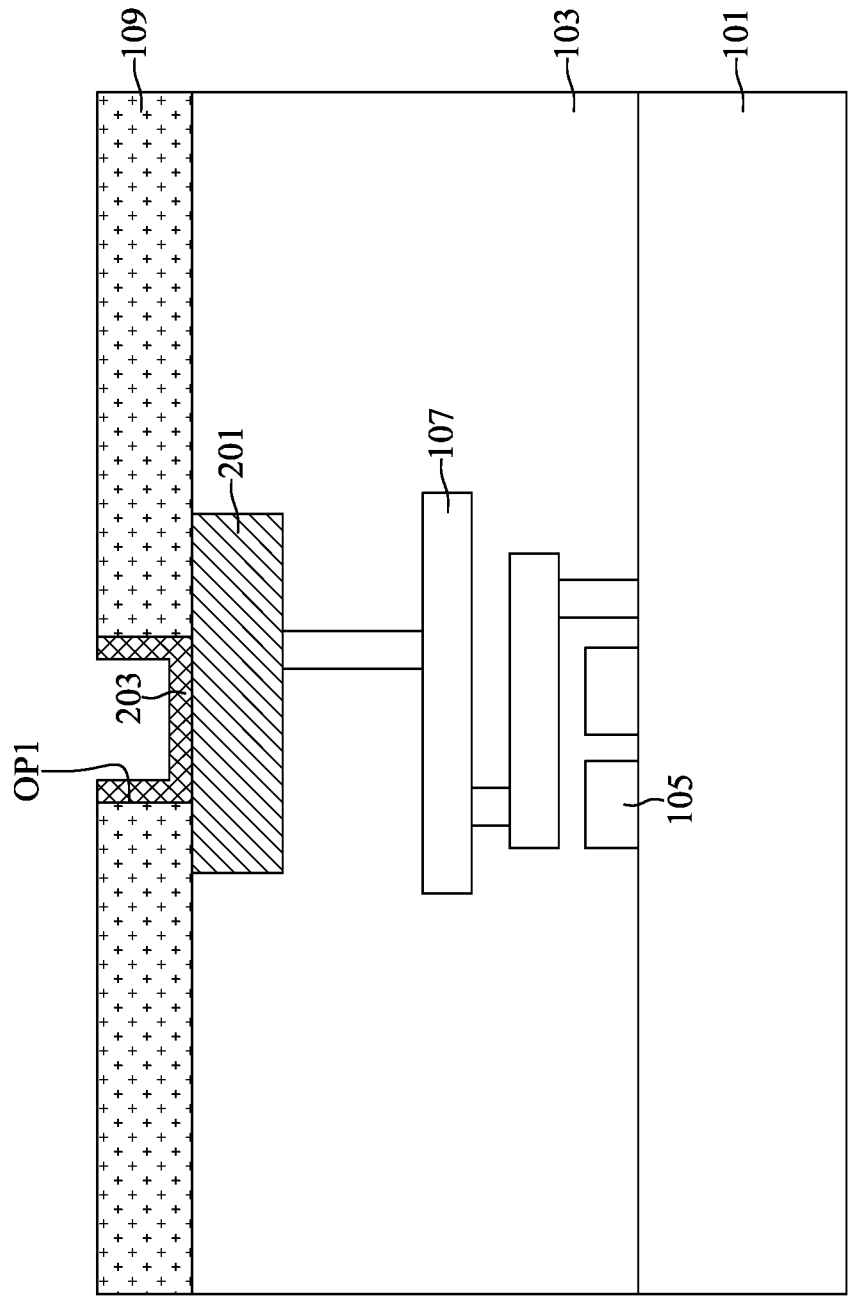
Figure 14:
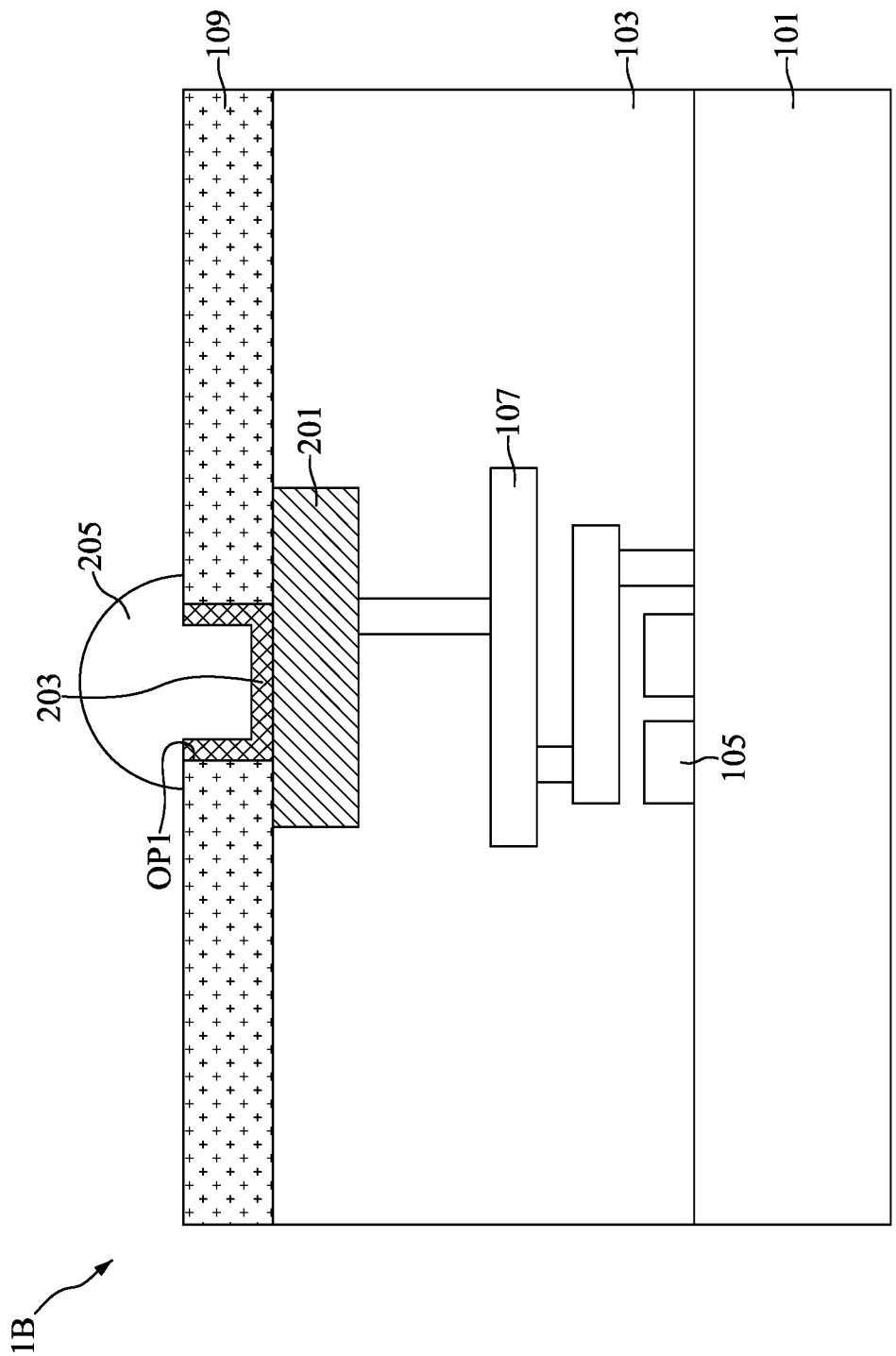

FIGS. 12 to 14 illustrate, in schematic cross-sectional view diagrams, a flow for fabricating a semiconductor device 1B in accordance with another embodiment of the present disclosure.

With reference to FIG. 12, an intermediate semiconductor device may be fabricated with a procedure similar to that illustrated in FIGS. 7 to 9. A layer of barrier material 401 may be conformally formed in the first opening OP1 and on the top surface of the first passivation layer 109. In some embodiments, the barrier material 401 may include aluminum fluoride. In some embodiments, the barrier material 401 may include zinc oxide. In some embodiments, the content of zinc oxide may be greater than the content of aluminum fluoride. In some embodiments, the layer of barrier material 401 may be formed by an atomic layer deposition method.

The atomic layer deposition method is a self-limiting, sequential unique film growth technique based on surface reactions that can provide atomic layer control and deposit conformal thin films of materials provided by precursors onto substrates of varying compositions. In the atomic layer deposition method, the precursors are separated during the reaction. The first precursor is passed over the substrate producing a monolayer on the substrate. Any excess unreacted precursor is purged out. A second precursor is then passed over the substrate and reacts with the first precursor, forming a monolayer of film on the substrate surface. This cycle is repeated to create a film of desired thickness.

In some embodiments, the precursors may be trimethylaluminum and hydrogen fluoride, which is from a hydrogen fluoride-pyridine solution. A process temperature of the atomic layer deposition method may be between about 75° C. and about 300° C. A carrier gas of the atomic layer deposition method may be nitrogen and a flow rate of the carrier gas may be between about 130 sccm and about 150 sccm.

With reference to FIG. 13, an etching process or a planarization process may be performed to remove the barrier material 401 formed on the top surface of the first passivation layer 109 to form the first barrier layer 203 having the U-shape cross-sectional profile. While the etching process is employed, the barrier material 401 formed in the first opening OP1 may be protected by a photoresist layer. The planarization process may be chemical mechanical polishing.

With reference to FIG. 14, the first connector 205 may be formed with a procedure similar to that illustrated in FIG. 11, and descriptions thereof are not repeated herein.

Figure 15:
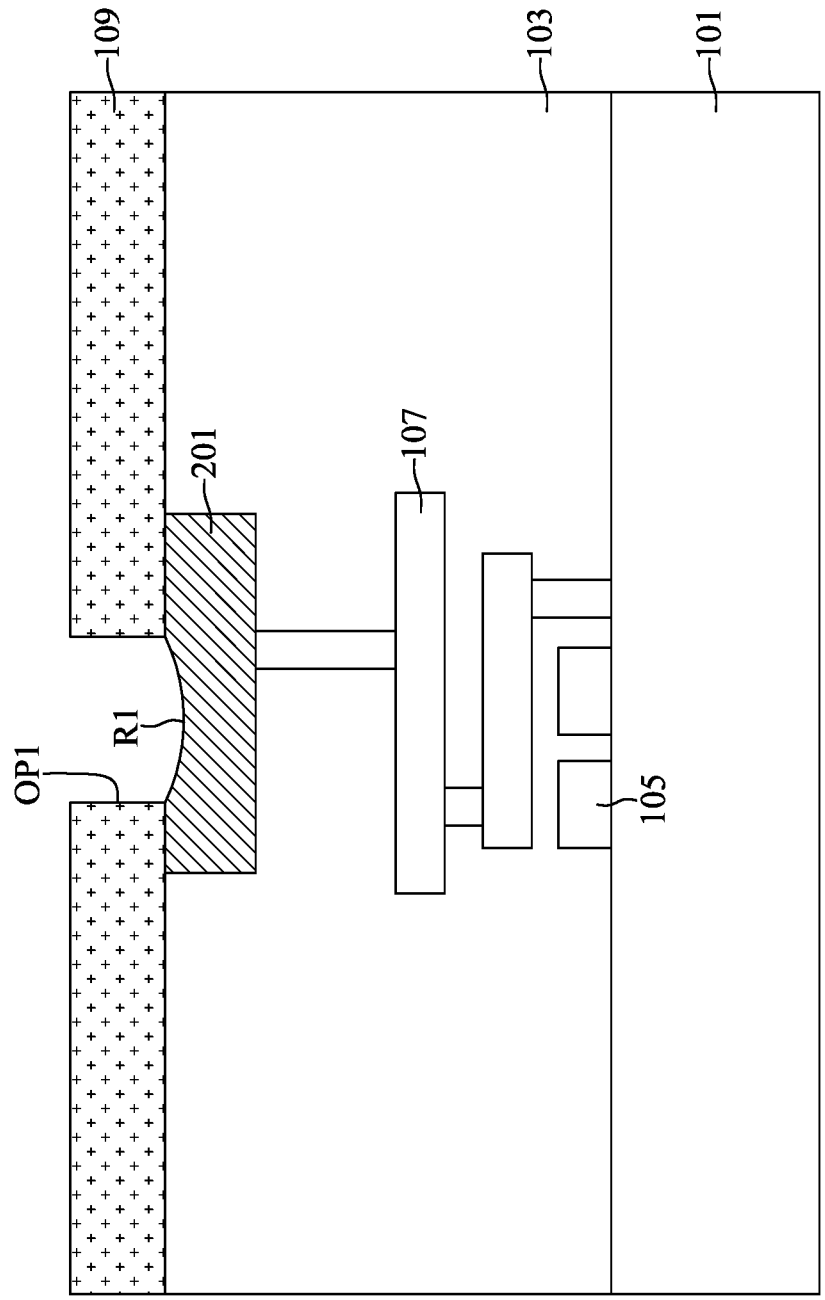
FIGS. 15 to 17 illustrate, in schematic cross-sectional view diagrams, a flow for fabricating a semiconductor device in accordance with another embodiment of the present disclosure.
Figure 16:
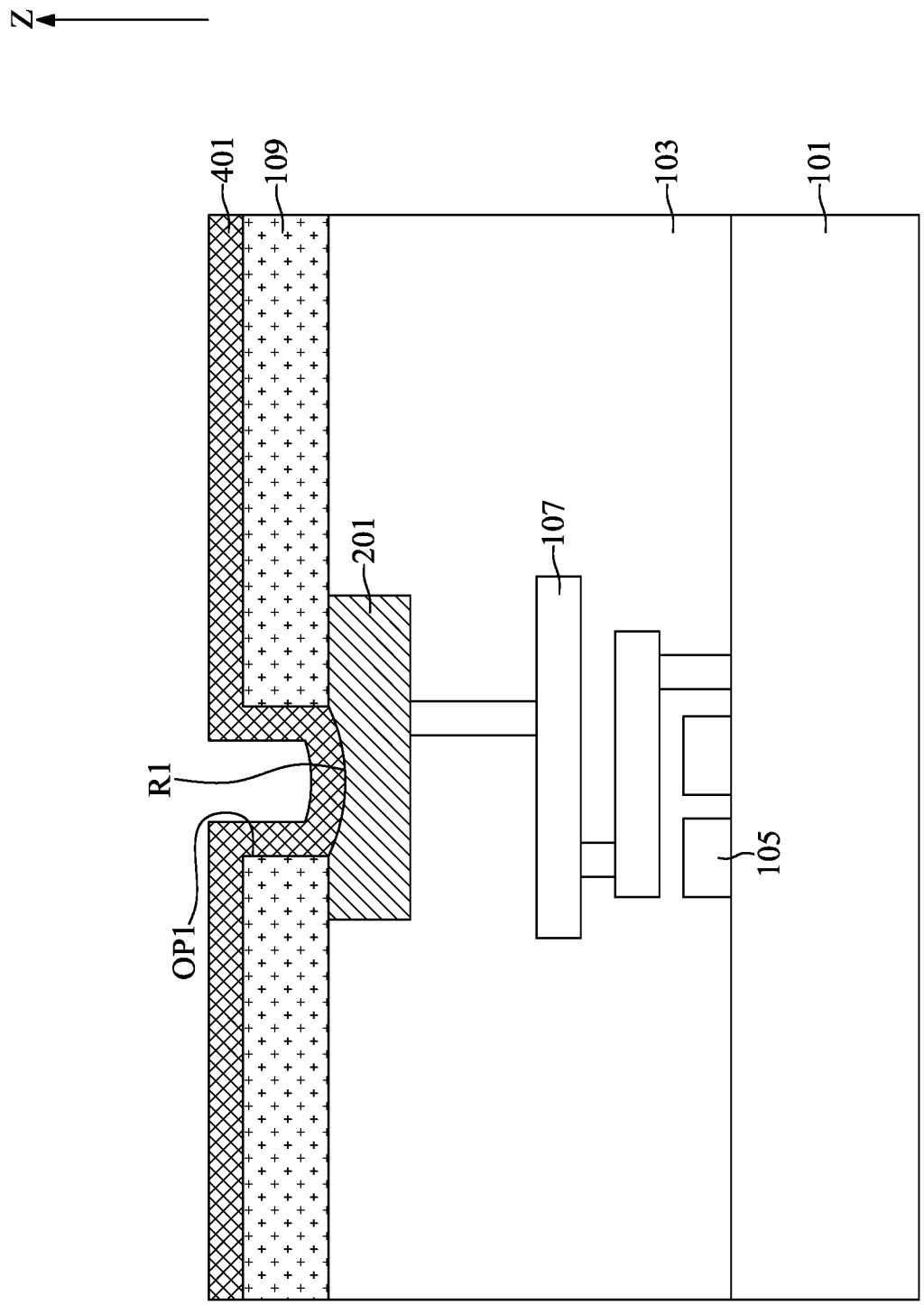
Figure 17:
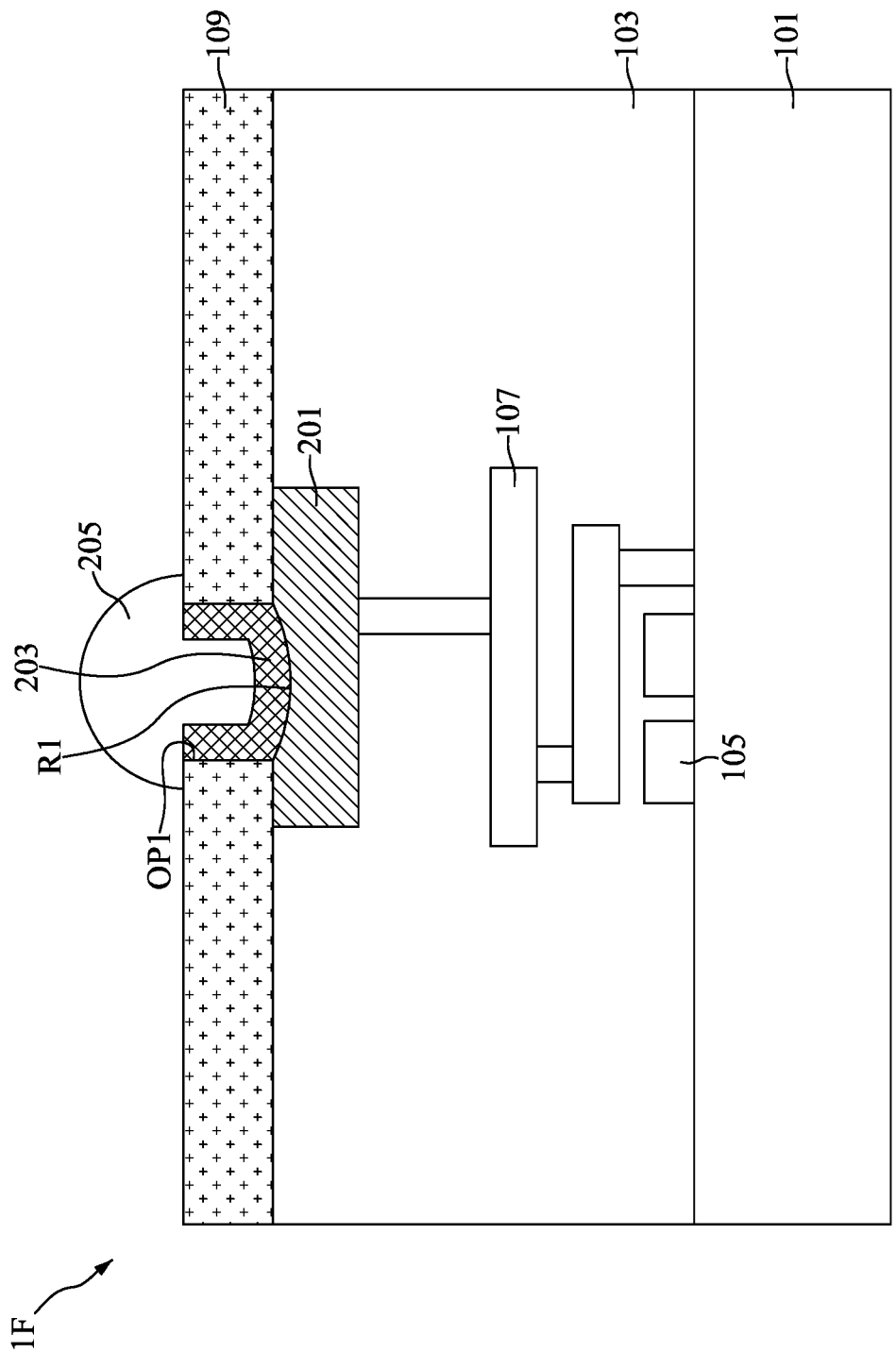

FIGS. 15 to 17 illustrate, in schematic cross-sectional view diagrams, a flow for fabricating a semiconductor device 1F in accordance with another embodiment of the present disclosure.

With reference to FIG. 15, an intermediate semiconductor device may be fabricated with a procedure similar to that illustrated in FIGS. 7 to 9. An isotropic etch process may be performed to form a first recess R1 on the pad layer 201. The first recess R1 makes the top surface of the pad layer 201 concave. In some embodiments, the etch rate of the pad layer 201 of the isotropic etch process may be faster than the etch rate of the first passivation layer 109 of the isotropic etch process. For example, an etch rate ratio of the pad layer 201 to the first passivation layer 109 may be between about 100:1 and about 1.05:1 during the isotropic etch process. For another example, the etch rate ratio of the pad layer 201 to the first passivation layer 109 may be between about 20:1 and about 10:1 during the isotropic etch process.

With reference to FIG. 16, the layer of barrier material 401 may be formed with a procedure similar to that illustrated in FIG. 12, and descriptions thereof are not repeated herein.

With reference to FIG. 17, the first barrier layer 203 and the first connector 205 may be formed with a procedure similar to that illustrated in FIGS. 13 and 14, and descriptions thereof are not repeated herein. The first recess R1 may increase the contact surface between the barrier material 401 and the pad layer 201. Hence, the contact resistance of the first barrier layer 203 may be reduced. As a result, the reliability of the semiconductor device 1F may be improved.

One aspect of the present disclosure provides a semiconductor device including a substrate, a circuit layer positioned on the substrate, a pad layer positioned in the circuit layer and including aluminum and copper, a first barrier layer positioned on the pad layer and including aluminum fluoride, and a first connector positioned on the first barrier layer.

Another aspect of the present disclosure provides a method for fabricating a semiconductor device including providing a substrate, forming a circuit layer on the substrate, forming a pad layer in the circuit layer, forming a first passivation layer on the circuit layer, forming a first opening along the first passivation layer to expose the pad layer, forming a first barrier layer on the pad layer and in the first opening, and forming a first connector on the first barrier layer. The pad layer includes aluminum and copper. The first barrier layer includes aluminum fluoride.

Due to the design of the semiconductor device of the present disclosure, the saturated bonding property of aluminum fluoride may prevent the underlying pad layer 201 from corrosion from various semiconductor processes, especially those processes including fluorine ions. As a result, the reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a circuit layer positioned on the substrate;
a pad layer positioned in the circuit layer and comprising aluminum and copper;
a first barrier layer positioned on the pad layer and comprising aluminum fluoride;
a first connector positioned on the first barrier layer;
a first passivation layer positioned on the circuit layer, wherein the first barrier layer is positioned in the first passivation layer, wherein a thickness of the first passivation layer is greater than a thickness of the first barrier layer; and
a cushion layer positioned in the circuit layer and topographically aligned with the pad layer, wherein the cushion layer is at a vertical level lower than a vertical level of the pad layer.

2. The semiconductor device of claim 1, wherein a bottom portion of the first connector is extending into the first passivation layer and positioned on the first barrier layer.

3. The semiconductor device of claim 1, wherein the first barrier layer comprises zinc oxide.

4. The semiconductor device of claim 1, further comprising a thermal dissipation layer positioned below the substrate.

5. The semiconductor device of claim 4, further comprising an attachment layer positioned between the thermal dissipation layer and the substrate.

6. The semiconductor device of claim 1, wherein the first barrier layer has a U-shaped cross-sectional profile.

* * * * *